(12) United States Patent
Fernández Robayna (10) Patent No.: US 9,906,211 B2
(45) Date of Patent: Feb. 27, 2018

(54) COMPENSATION OF BASELINE WANDER (71) Applicant: Analog Devices Global, Hamilton (BM)

(72) Inventor: Miguel Ángel Fernández Robayna, Madrid (ES)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/226,564

(22) Filed: Aug. 2, 2016

(65) Prior Publication Data

US 2017/0250682 A1 Aug. 31, 2017

Related U.S. Application Data (60) Provisional application No. 62/244,049, filed on Oct. 20, 2015.

(51) Int. Cl.
*H03L 5/00* (2006.01)
*H03K 5/007* (2006.01)
*H04B 1/04* (2006.01)

(52) U.S. Cl.
CPC ............... *H03K 5/007* (2013.01); *H04B 1/04* (2013.01)

(58) Field of Classification Search
CPC .................................. H03K 5/007; H04B 1/04
USPC ............................... 327/307; 330/9; 375/317
See application file for complete search history.

(56) References Cited

U.S. PATENT DOCUMENTS

| 4,755,783 | A | 7/1988 | Fleischer et al. |  |
| 5,465,272 | A * | 11/1995 | Smith | H04L 25/066 375/258 |
| 6,408,032 | B1 * | 6/2002 | Lye | H04L 25/0266 327/307 |
| 6,433,608 | B1 | 8/2002 | Huang |  |
| 6,841,855 | B2 | 1/2005 | Jaeck et al. |  |
| 7,136,421 | B2 | 11/2006 | Lin et al. |  |
| 7,215,720 | B2 | 5/2007 | Yeh |  |
| 7,218,687 | B2 | 5/2007 | Huang et al. |  |
| 8,098,768 | B2 * | 1/2012 | Langner | H04B 3/06 375/257 |
| 8,543,190 | B2 | 9/2013 | Wasson et al. |  |
| 9,491,008 | B2 * | 11/2016 | Dong | H04L 25/03019 |

(Continued)

FOREIGN PATENT DOCUMENTS

TW 486901 B 5/2011
WO WO-2017068423 A1 4/2017

OTHER PUBLICATIONS

"Spanish Application Serial No. 21631006, Office Action dated Sep. 14, 2016", 3 pgs.

(Continued)

*Primary Examiner* — Kenneth B Wells
(74) *Attorney, Agent, or Firm* — Schwegman Lundberg & Woessner, P.A.

(57) ABSTRACT

A circuit for compensation of baseline voltage wander operating at an input of an isolator is disclosed. The circuit can compensate electronically the frequency response of an isolation circuit (e.g., a transformer) by increasing the pass band in the low frequency region in order to minimize the baseline wander caused by low inductance windings. The compensation circuit can be used to inject a current ramp proportional to the amplitude and the duration of the pulse and inversely proportional to the open circuit inductance of the isolation circuit.

20 Claims, 9 Drawing Sheets (56) References Cited

U.S. PATENT DOCUMENTS

| | | |
|---|---|---|
| 2008/0137759 A1 | 6/2008 | Cai et al. |
| 2008/0159414 A1 | 7/2008 | Brecher et al. |
| 2008/0159415 A1 | 7/2008 | Miller et al. |
| 2009/0202003 A1 | 8/2009 | Langner et al. |
| 2013/0339765 A1 | 12/2013 | Diab |
| 2014/0232502 A1 | 8/2014 | Gutierrez et al. |

OTHER PUBLICATIONS

"Ethernet Protection Design Guide", Littelfuse, Inc., (2015), 1-32.
Siegel, Adam C., "Foldable Prrinted Circuit Boards on Paper Substrates", Advanced Function Materials, 20, (2010), 28-35.
Weon, Dae-Hee, et al., "3-D Integrated Inductors and Transformers on Liquid Crystal Polymer Substrate"; IEEE, (2006), 1381-1384.
"International Application Serial No. PCT/US2017/034202, International Search Report dated Sep. 14, 2017", 6 pgs.
"International Application Serial No. PCT/US2017/034202, Written Opinion dated Sep. 14, 2017", 6 pgs.

\* cited by examiner

COMPENSATION OF BASELINE WANDER

CLAIM OF PRIORITY

This application claims the benefit of the priority of Spanish Patent Application Number 201631006, titled "COMPENSATION OF BASELINE WANDER," and filed with the Spanish Patent and Trademark Office (SPTMO) on Jul. 22, 2016, the entirety of which is hereby incorporated by reference herein.

BACKGROUND

Many communication systems exchange data using an isolator circuit, such as a transformer. For example, in an Ethernet communication system, the IEEE 802.3 (e.g., Institute of Electrical and Electronics Engineers 802.3-2012) standard specifies that electrical isolation be provided between an Ethernet physical layer circuit—usually referred to as an "Ethernet PHY"—and an Ethernet port (e.g., a medium-dependent interface (MDI)), which provides a physical and electrical connection to a cabling medium (e.g., ANSI/TIA-568-C.0, Generic Telecommunications Cabling for Customer Premises, Category 5)). In such Ethernet implementations, data may be transmitted from an Ethernet-enabled device onto the cabling medium using a transformer.

However, using a transformer to transmit data between isolated systems or subsystems may be associated with certain drawbacks. For example, baseline wander may occur, when voltage driven on the transformer droops over time as energy leaks out of the transformer due to its inductive nature in conjunction with other impedances to which it is coupled. Applications and standards may require limiting such baseline wander.

Prior approaches to limiting baseline wander include using a transformer having an inductance value that either complicates or precludes use of an integrated transformer circuit. For example, some Ethernet standards may translate to use of a transformer inductance of at least 80 microHenry ($\mu H$) or more, such as even 350 $\mu H$ or more.

SUMMARY OF THE DISCLOSURE

Embodiments of the present disclosure can provide a circuit for compensation of overall baseline voltage wander operating at an input of an isolator. The circuit can include a filter circuit and a driver circuit. The filter circuit can be configured to receive an input voltage signal from an input of the isolator and configured to generate a filtered representation of the voltage signal. The driver circuit can be configured to use information about a voltage magnitude extracted from the filtered representation of the voltage signal to generate an output current ramp signal. The driver circuit can be further configured to inject the output current ramp signal into the input of the isolator to reduce or suppress voltage droop in the input voltage signal when the input voltage signal is applied to the input of the isolator.

In an example, a compensation loop circuit for compensation of baseline voltage wander at an input of an isolator can include a filter circuit, a gain circuit, and a driver circuit. The filter circuit can be coupled to an input of the isolator. The filter circuit can be configured to receive an input voltage signal from the input of the isolator and generate a filtered representation of the voltage signal. The gain circuit can be coupled to an output of the filter circuit, and can be configured to amplify the filtered representation of the voltage signal to generate an amplified voltage signal. The driver circuit can be coupled to an output of the gain circuit and an input of the filter circuit to form the compensation loop circuit. The driver circuit can be configured to generate an output current ramp signal based on the amplified voltage signal. The driver circuit can be further configured to inject the output current ramp signal into the input of the isolator to reduce or suppress voltage droop in the input voltage signal when the input voltage signal is applied to the input of the isolator. The output current ramp signal can be configurable based on a voltage gain associated with the input voltage signal and an output voltage signal corresponding to the output current ramp signal.

In an example, a method for generating a signal to compensate baseline voltage wander can include receiving an input voltage signal from an input of an isolator circuit. The received input voltage signal can be filtered to generate a filtered representation of the voltage signal. A current ramp signal can be generated, where the current ramp signal can be proportional to inductance associated with the isolator circuit and a voltage magnitude extracted from the filtered representation of the voltage signal. The current ramp signal can be injected into the input of the isolator to reduce or suppress voltage droop in the input voltage signal when the input voltage signal is applied to the input of the isolator.

This overview is intended to provide an overview of subject matter of the present patent application. It is not intended to provide an exclusive or exhaustive explanation of the invention. The detailed description is included to provide further information about the present patent application.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

One approach can provide a compensation circuit to compensate electronically the frequency response of an isolation circuit (e.g., a transformer) by increasing the pass band in the low frequency region in order to minimize the baseline wander (e.g., voltage droop) caused by low inductance windings. For example, the compensation circuit can be used to inject a current ramp proportional to the amplitude and the duration of the pulse and inversely proportional to the open circuit inductance (OCL) of the isolation circuit. This approach allows use of an isolation circuit, such as a magnetic device, having a smaller inductance value than a corresponding isolation scheme lacking the compensation circuit.

Figure 1:
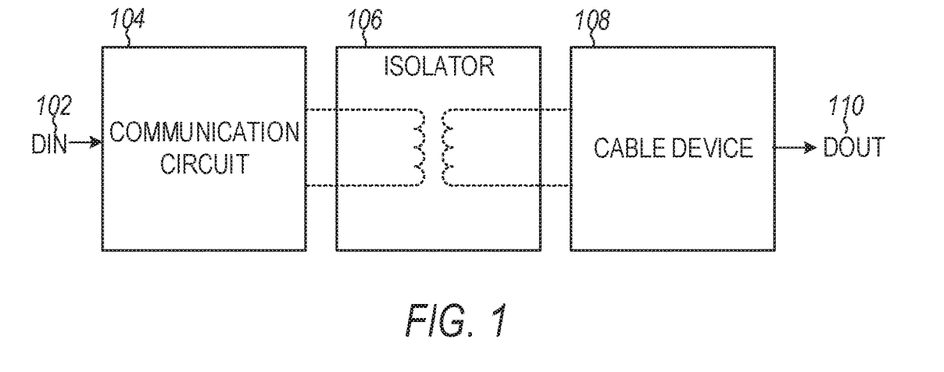
FIG. 1 depicts a communication system providing improved communication of data using an isolator, in accordance with an example embodiment.

FIG. 1 depicts a communication system providing improved communication of data using an isolator, in accordance with an example embodiment. Referring to FIG. 1, the communication system may include a communication circuit 104 located on a first side of an isolation barrier 107, a cable device 108 located on a second side of the isolation barrier, and an isolator circuit 106. The communication circuit 104 can be configured to receive a data signal 102 for transmission across a cable via the isolator circuit 106. The cable device 108 can provide a data output signal 110 as a result of receiving a transmission from the communication circuit 104 over the isolator circuit 106.

The isolator circuit 106 can be configured to provide communication between the communication circuit 104 and the cable device 108 across the isolation barrier 107. In embodiments, the isolator circuit 106 can be a transformer. In other embodiments, the isolator circuit 106 can be another type of an isolator device for which baseline wander or other similar phenomena may be a concern, such as one or more of another type of inductive isolator, an optical isolator, or a capacitive a isolator, as illustrative examples. In an embodiment, the isolator circuit can include a series and/or parallel combination of inductive devices.

Figure 2:
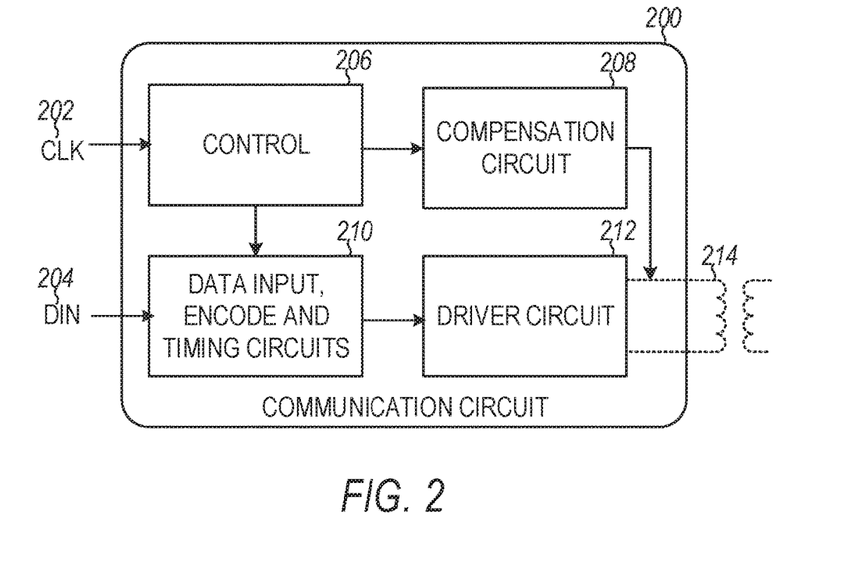
FIG. 2 depicts a communication circuit with an integrated compensation circuit, in accordance with an example embodiment.

FIG. 2 depicts a communication circuit with an integrated compensation circuit, in accordance with an example embodiment. Referring to FIG. 2, the communication circuit 200 can include a data input 204, data input, encode and timing circuit 210, a driver circuit 212, a compensation circuit 208, and a control circuit 206. The driver circuit 212 can be coupled to an isolator circuit 214, such as a transformer or another type of isolation circuit. In an embodiment, the components of the communication circuit 200 can be integrated on the same integrated circuit substrate. In an embodiment, the components of the communication circuit 200 can be included in the same circuit package. In an embodiment, the isolation circuit 214 (or one or more portions of it) can be integrated on the same integrated circuit substrate as the communication circuit 200. In an embodiment, the isolation circuit 214 (or one or more portions of it) can be a separate circuit, integrated on a second integrated circuit substrate packaged together in the same package as an integrated circuit substrate including the communication circuit 200.

The data input, encode and timing circuit 210 can be configured to receive an input data signal 204 for transmission across the isolator circuit 214 to a cable device. In response, the data input, encode and timing circuit 210 can be configured to perform one or more of data synchronization, framing, encoding, or other operations, and can generate a driver input signal representing the input data 204 for transmission. The driver circuit 212 can be configured to receive the driver input signal from the data input, encode and timing circuit 210. In response, the driver circuit 212 can drive a corresponding signal on the isolation circuit 214 (e.g., the primary side of a transformer). The compensation circuit 208 can be configured to provide a current to the isolation circuit 214 (e.g., to the primary side of the transformer) to compensate for baseline wander that may be experienced at the transformer in conjunction with transmitting the data signal. The control circuit 206 can be configured to receive a clock signal 202 and control one or more of the data input, encode and timing circuit 210, the compensation circuit 208, or the driver circuit 212.

Figure 3:
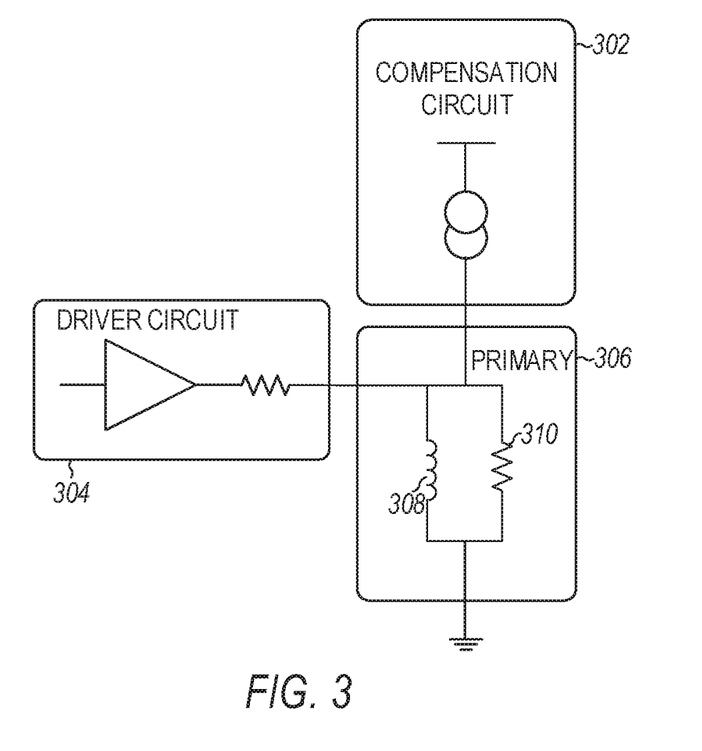
FIG. 3 illustrates a compensation circuit coupled to an equivalent circuit representing a primary side of a transformer, in accordance with an example embodiment.

FIG. 3 illustrates a compensation circuit coupled to an equivalent circuit representing a primary side of a transformer, in accordance with an example embodiment. Referring to FIG. 3, the driver circuit 304 can include a voltage driver circuit 304a and a termination impedance 304b. The current compensation circuit 302 can include a controlled current source 302a. The equivalent primary circuit 306 can include an inductance 308 and a resistance 310 representing a termination impedance (e.g., termination impedance at a secondary side of a transformer, reflected back to the primary side of the transformer). For clarity of illustration, other components of the driver circuit 304 and the current compensation circuit 302 are omitted in FIG. 3. For example, the controlled current source 302a of the current compensation circuit 302 can include suitable components to generate selected currents, such as one or more of a digital to analog converter, a timer, and transistors, and can be controlled using control signals received from a control circuit (e.g., 206 in FIG. 2).

FIG. 3 illustrates an open-loop arrangement of the compensation circuit 302, which can be used to compensate for baseline wander in instances when voltage and duration of a voltage signal generated by the driver circuit 304 are known. For example, the open-loop arrangement of the compensation circuit 302 can be used in circuits with known characteristics of the transmit signal (e.g., 10/100Base-T communication circuits). The compensation circuit 302 can be configured to generate a current to compensate for the baseline wander experienced at the equivalent primary circuit 306. That is, the compensation circuit 302 can be configured to inject a current into the primary side of a transformer (e.g., the equivalent primary circuit 306) in an amount that compensates for any energy lost due to the inductive nature of the transformer. The relationship between inductance, voltage and current may be represented by the following equation:

$$V(t) = L\frac{di(t)}{dt},$$

where v(t) is the voltage at the equivalent primary circuit 306, i(t) is the current in the equivalent primary circuit 306, and L is the inductance in the equivalent primary circuit 306 of the primary side of the transformer. To eliminate baseline wander, the compensation circuit can be configured to establish a constant or substantially constant v(t). As an illustration, to generate a constant v(t), a current i(t) may be determined as follows:

$$\int di(t) = \frac{V}{L}\int dt,$$

$$i(t) = \frac{V}{L}[t - t0] = \frac{V}{L}\Delta T$$

Therefore, the current for generating a constant (or substantially constant voltage) may be a current ramp proportional to time, with a slope of V/L.

Figure 4:
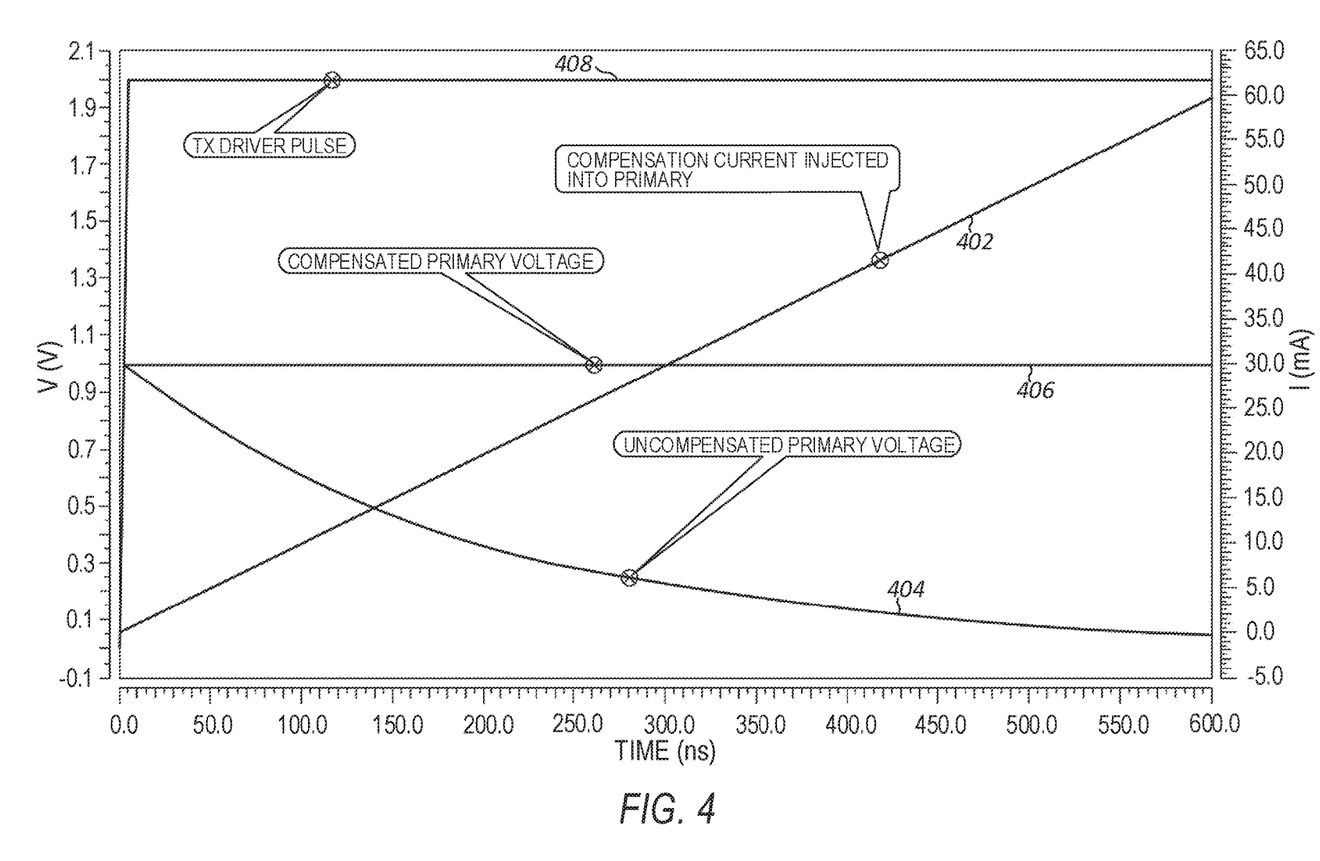
FIG. 4, FIG. 5 and FIG. 6 are signal diagrams depicting example signals of the communication circuit, including the compensation circuit and the equivalent circuit, in accordance with an example embodiment.
Figure 5:
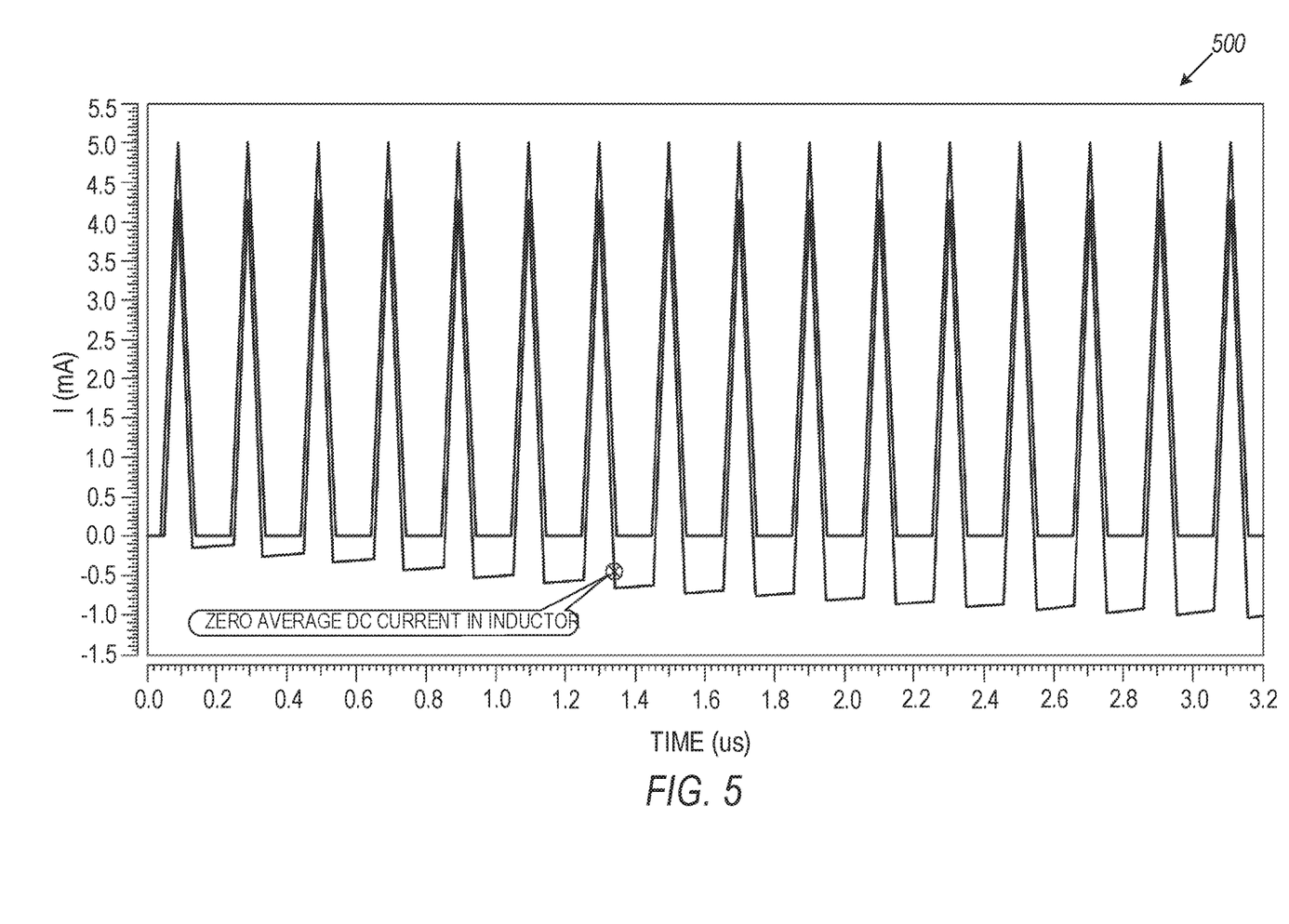
Figure 6:
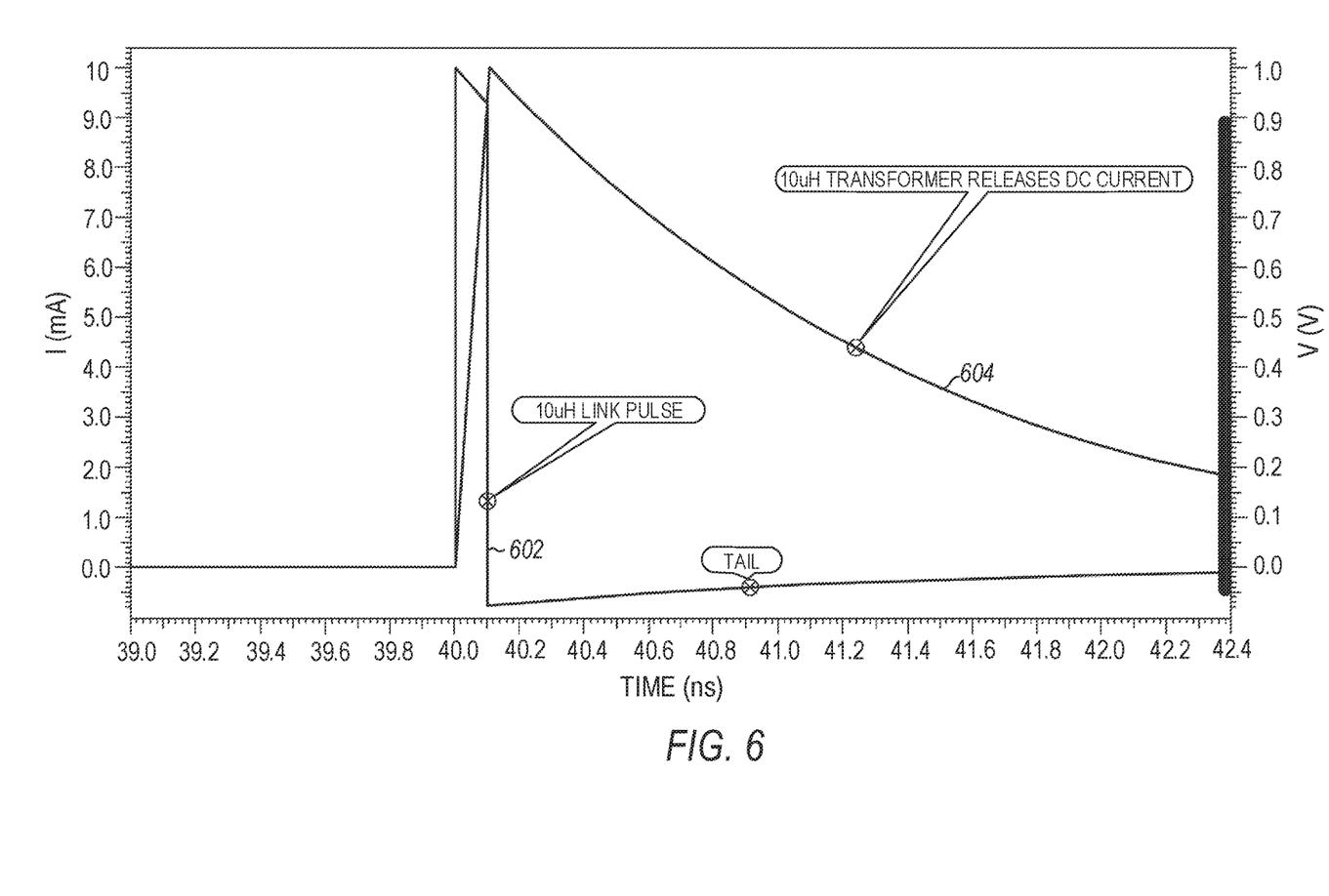

FIG. 4, FIG. 5, and FIG. 6 are signal diagrams depicting example signals of the communication circuit, including the compensation circuit and the equivalent circuit, in accordance with an example embodiment.

FIG. 4 shows an example driver pulse 408 generated by the driver circuit (e.g., 304). The driver pulse 408 is characterized by a certain amplitude and can be substantially constant. The driver pulse 408 can experience a voltage division as a result of the termination impedances (e.g., 310). As a result, a voltage appearing on the primary side of a transformer (e.g., at the equivalent primary circuit 306) can be lowered (e.g., halved). FIG. 4 also illustrates an example voltage signal 404 appearing at the equivalent primary circuit 306 as a result of the driver pulse without any compensation, such as without the compensation circuit or with the compensation circuit disabled. As seen in FIG. 4, the voltage signal 404 droops over time.

FIG. 4 further illustrates an example voltage signal appearing at the equivalent primary circuit 306, with a compensation current provided by the compensation circuit 302, to eliminate or substantially eliminate the voltage droop. As seen in FIG. 4, the primary voltage signal 406 is constant or substantially constant. FIG. 4 further illustrates an example compensation current signal 402, which can be provided by the compensation circuit 302 to compensate for the voltage drop in the primary voltage signal 404. As seen in FIG. 4, the current signal 402 is in the form of a ramp signal, starting at the beginning of the driver pulse 408 and having a slope selected as discussed above to produce a constant or substantially constant voltage signal 406.

In an example, the compensation circuit 302 can be configured to provide a current that only partially compensates for baseline wander or other phenomenon. For example, the compensation circuit 302 can be configured to provide a ramp current with a slope less than that required to fully compensate. This may enable avoidance of providing a non-zero average compensation current. Even though some amount of baseline wander may be experienced, the extent of baseline wander may be acceptable.

FIG. 5 illustrates an example current signal 500 generated in the transformer primary side (e.g., at the equivalent primary circuit 306) using a compensation current less than the amount required to fully compensate for baseline wander. As seen in FIG. 5, the compensation current may produce a zero average DC current at the equivalent primary circuit 306, but also allowing for a certain amount of baseline wander.

In an example, the compensation current gain (slope) can be limited to, e.g., avoid saturating the transformer. For example, the compensation current generated by the compensation circuit 302 can be released after every ramp period compensating for a data pulse. In this way, the cumulative compensation current and/or primary current over time (many signal periods) does not rise continuously (e.g., as seen in FIG. 4).

FIG. 6 illustrates an example voltage pulse 602 and a current signal 604 produced in the transformer primary side using a limited gain (slope) compensation current that is released after the end of the pulse. As seen in FIG. 6, the compensation current signal 604 can compensate during the data pulse but allow energy to be released by the transformer outside of the data pulse.

Figure 7:
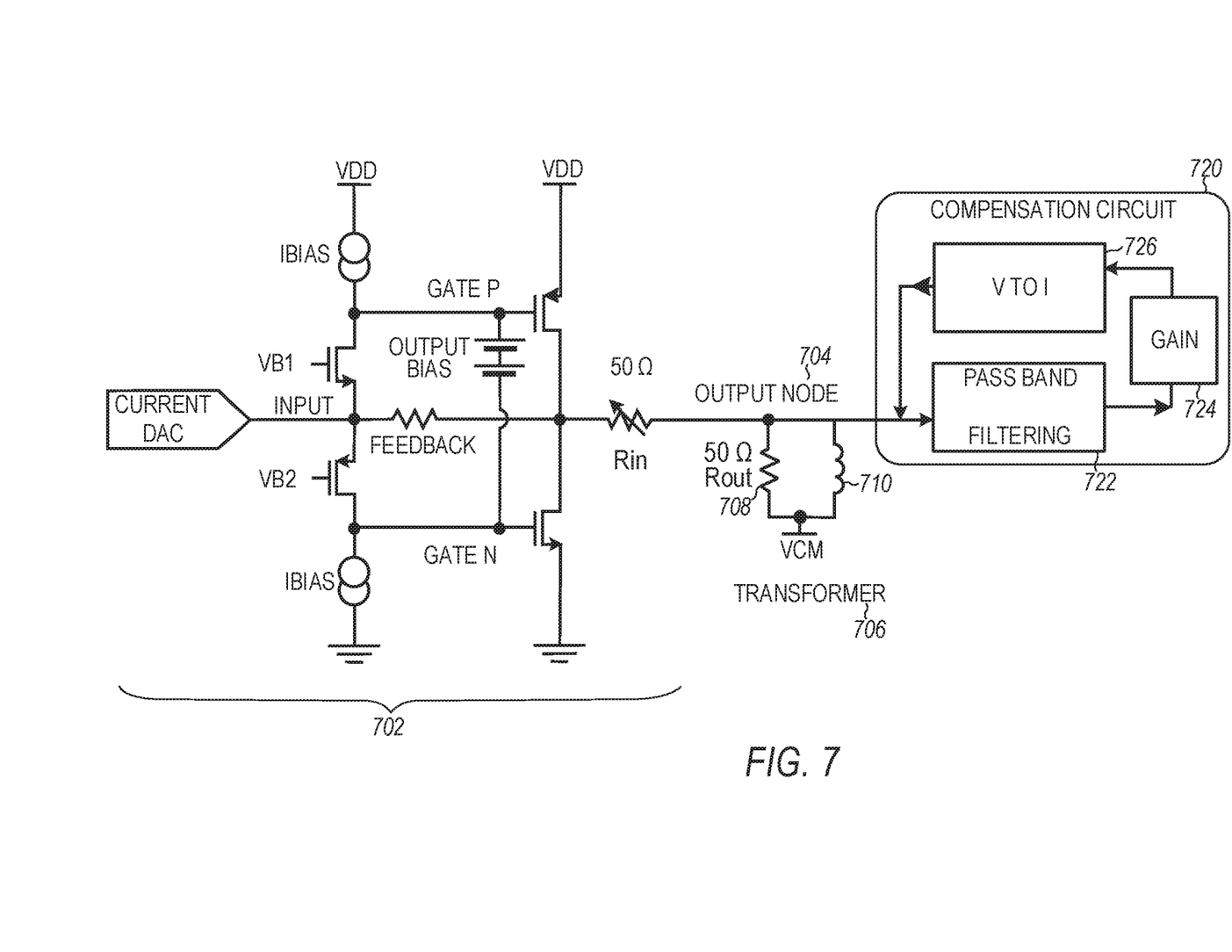
FIG. 7 illustrates a compensation circuit, in accordance with an example embodiment.

FIG. 7 illustrates a compensation circuit, in accordance with an example embodiment. Referring to FIG. 7, the compensation circuit 720 can include a band-pass filter circuit 722, a gain circuit 724, and a current driver circuit 726. As seen in FIG. 7, the compensation circuit 720 can be provided in a closed-loop configuration, with the input to the filtering circuit 722 being coupled to the output of the driver circuit 726 (e.g., at the node 704). The compensation circuit 720 can be connected to the equivalent primary circuit 706, driven by an uncompensated (or insufficiently compensated) communication circuit 702. In an example, the circuit 702 can be a push/pull driver circuit. In an example, the equivalent primary circuit 706 can represent a primary side of a transformer, including an inductance 710 and a resistance 708 representing a termination impedance (e.g., termination impedance at a secondary side of a transformer, reflected back to the primary side of the transformer).

In an example, the loop of the compensation circuit 720 can result in a current, such as, e.g., a ramp current or similar current as discussed above, being provided to the primary to compensate for the uncompensated or insufficiently compensated communication circuit.

In an example, the compensation circuit 720 can be a stand-alone circuit or it can be co-integrated with the driver circuit 702 and/or the equivalent primary circuit 706.

In an example, the compensation circuit 720 configured in closed-loop mode can be used for compensating baseline wander of an output signal, when characteristics of the output signal are not known (e.g., pulse duration and voltage level). For example, the closed-loop compensation circuit 720 can be used in connection with a full-duplex Gigabit PHY circuit operating in 1000Base-T mode. In this case, the compensation circuit can automatically boost low frequencies to reduce baseline wander droop of any signal at the output node 704 of the driver circuit 702. Example closed-loop modeling of a compensation circuit is illustrated in connection with FIG. 9A and FIG. 9B.

Referring again to FIG. 2, the depicted communication circuit 200 can be configured to provide either single-ended or differential signals. For example, a driver circuit and a compensation circuit (such as circuits 302, 304, 720, and 702 depicted in FIGS. 3 and 7) can be connected to a single end of a primary side of a transformer to drive the transformer in a single ended manner. To implement a differential circuit, two instances of a driver circuit and a compensation circuit (such as circuits 302, 304, 720, and 702 depicted in FIGS. 3 and 7) can be connected, or a driver circuit and a compensation circuit can be configured to provide two differential outputs, to two ends of the primary side of a transformer to drive the transformer in a differential manner.

Figure 8:
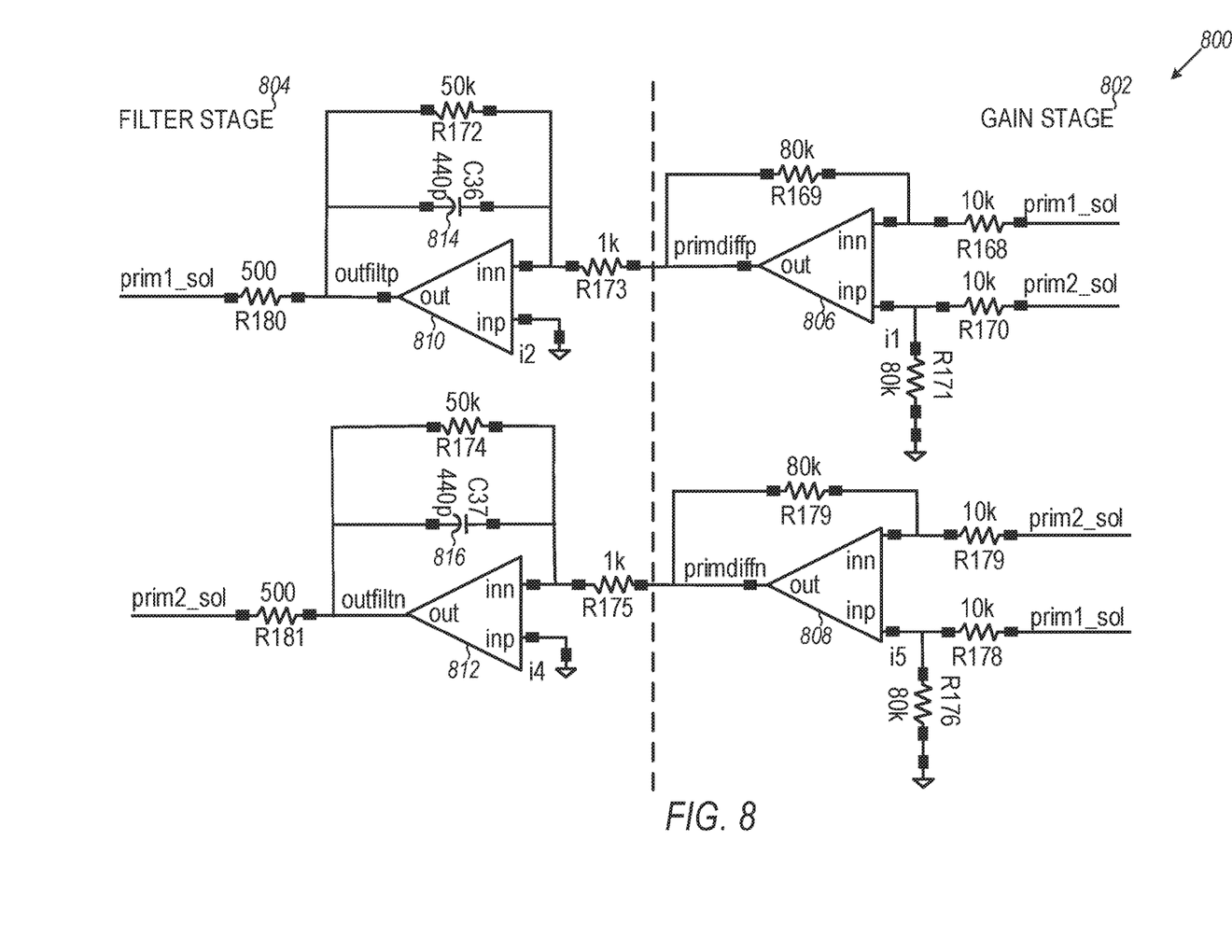
FIG. 8 illustrates an example embodiment of a filter stage and a gain stage for the compensation circuit of FIG. 7.

FIG. 8 illustrates an example embodiment of a filter stage and a gain stage for the compensation circuit of FIG. 7. Referring to FIG. 8, the filter stage 804 and gain stage 802 include differential inputs and outputs, and can correspond to the filter circuit 722 and gain circuit 724 of FIG. 7, respectively. In an example, the filter stage 804 can include operational amplifiers 810 and 812 coupled to respective capacitors 814 and 816. In an example, the gain stage can include operational amplifiers 806 and 808. Other implementations of the gain stage 802 and the filter stage 804 can also be used in different embodiments.

Figure 9A:
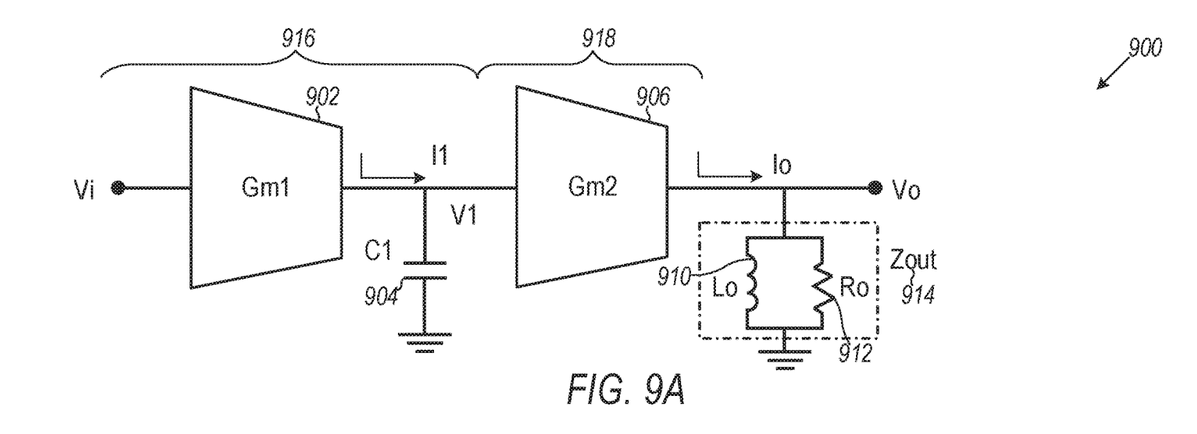
FIG. 9A and FIG. 9B illustrate example embodiments of a compensation circuit.
Figure 9B:
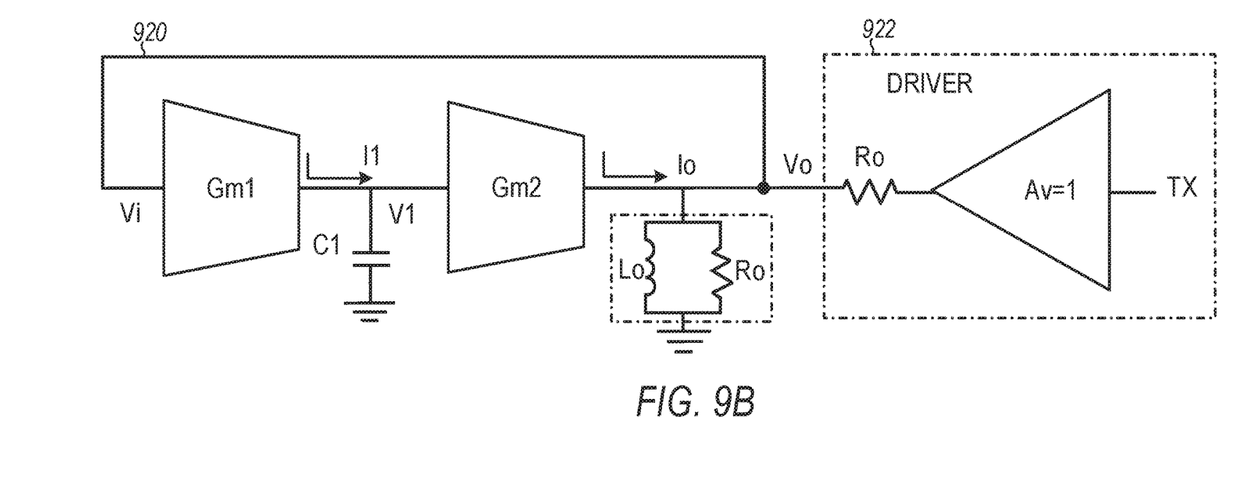

FIG. 9A and FIG. 9B illustrate example embodiments of a compensation circuit. Referring to FIG. 9A, the compensation circuit 900 includes a filter stage 916 and a driver stage 918. The filter stage 916 can include a transconductance stage 902 (with transconductance Gm1) coupled to a capacitor 904, forming a Gm-C filter. The driver stage 918 can include a transconductance stage 906 (with transconductance Gm2). The output of the driver stage 918 can be coupled to an equivalent primary circuit 908, which can include an inductance 910 and a resistance 912 representing a termination impedance (e.g., termination impedance at a secondary side of a transformer, reflected back to the primary side of the transformer). The total output impedance can be designated as Zout 914.

The compensation circuit 900 can be an example implementation of the closed-loop compensation circuit 720 but with an open loop where the input voltage node Vi and the output voltage node Vo are separated (in a closed-loop operation, the input node Vi and the output node Vo are the same).

The output current at the filtering stage 916 is $$I1 = Vi * Gm1$$

The output current I1 is applied to the integrating capacitor C1, resulting in the voltage across C1 being given by $$V1 = \frac{I1}{sC1} = \frac{Vi * Gm1}{sC1}$$

Where $$w1 = \frac{Gm1}{C1}$$

is the unity-gain frequency of the Gm-C integrator 902 and 904.

The output current at the driver stage 918 is $$Io = Gm2 * V1$$

The output current Io is applied to the output impedance Zout, resulting in the voltage across Zout being given by $$Vo = Io * Zout = Gm2 * V1 * Zout = Vi * Gm1 * Gm2 * \frac{Zout}{sC1},$$

where Zout is the parallel of the termination impedance and the open circuit inductance (OCL) of the equivalent primary circuit 908.

$$Zout = \frac{sLoRo}{Ro + sLo}$$

For low frequencies the term sLo<<Ro and the output impedance at low frequencies can be considered dominated by the inductor. The output impedance can be expressed as follows:

$$Zout_{(low\ freq)} \approx sLo$$

Therefore, the gain of the loop of the compensation circuit 900 at low frequencies can be expressed as follows:

$$Av = \frac{Vo}{Vi} = Gm1 * Gm2 * \frac{Lo}{C1}$$

The input voltage (Vi) is amplified by the loop gain (Av) and is converted into current (Io) by the transconductance factor (Gm2) of the integrator 906 before being injected at the equivalent primary circuit 908.

In an example, the compensation circuit 900 can operate in positive feedback mode, and will be stable when |Av|<1. Additionally, different C1 values can correspond to different equivalent inductance values for a given |Av|. Different |Av| values can correspond to different current gain slopes and may be used to select the baseline wander droop. Different |Av| values can also be used to limit the amount of injected current to minimize saturation effect in the transformer. Based on the above equation for the loop gain, variations in inductance associated with the circuit 908 can be addressed by adjusting the capacitance C1 of the integrating capacitor 904 so as to keep the loop gain stable.

FIG. 9B illustrates the compensation circuit 900 in a closed-loop configuration, where the input voltage signal Vi is connected to the output voltage signal Vo using a connection 920. Additionally, a driver circuit 922 is coupled to the output voltage signal Vo as well as the primary equivalent circuit 908.

In an example, the compensation circuit can be integrated with a transformer (e.g., with the equivalent primary circuit 908), and the transformer can include a temperature sensor. The temperature sensor can monitor internal temperature of the transformer and transformer inductance (OCL) can be estimated based on the temperature (e.g., by using a look-up table). In this regard, a gain (e.g., "Av") correction can be made (e.g., by adjusting C1) when the transformer inductance changes with temperature.

In an example, assuming transconductance of the compensation circuit 900 is fixed, the medium frequency gain will be dominated by the value of the inductance Lo (of circuit 910) and the internal parameters Gm1, Gm2 and capacitance (C1) of the integration capacitor 904. In this regard, individual transconductance values Gm1 and Gm2, inductance (Lo) and capacitance (C1) can be controlled and adjusted dynamically to keep the loop gain (Av) constant. For any given value of external inductance (Lo), the loop transconductance (Gm1*Gm2) or the internal capacitance C1 can be adjusted to ensure the stability of the loop gain target.

In an example, the inductance value (Lo) can be measured at start up or dynamically to adjust, for example, based on temperature and aging variations. In another example, a transformer can be characterized individually in production tests and inductance values (OCL) can be stored in a look-up table. In this regard, for any given value of the transformer OCL, the compensation loop can be adjusted to increase the low frequency range of the transformer and minimize the voltage droop.

Figure 10:
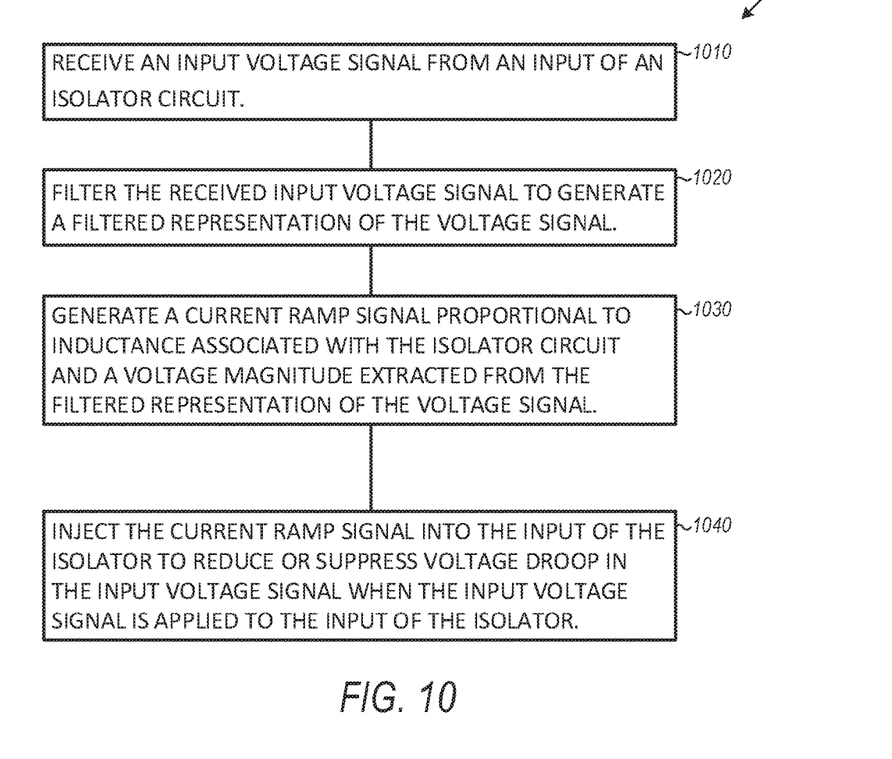
FIG. 10 illustrates a flow diagram of an example method for generating a signal to compensate baseline voltage wander, in accordance with an embodiment.

FIG. 10 illustrates a flow diagram of an example method for generating a signal to compensate baseline voltage wander, in accordance with an embodiment. Referring to FIG. 10, the example method 1000 may start at 1010, when an input voltage signal is received from an input of an isolator circuit. For example and in reference to FIG. 7 and FIG. 9A, the primary equivalent circuit 706 can be used as an isolator circuit, and the compensation circuit 720 can receive an input voltage signal Vi.

At 1020, the received input voltage signal can be filtered to generate a filtered representation of the voltage signal. For example, the input signal Vi can be filtered by the filtering circuit (722 or 916) to generate the filtered representation V1 of the input voltage signal Vi. At 1030, a current ramp signal is generated, where the ramp signal is proportional to inductance associated with the isolator circuit and a voltage magnitude extracted from the filtered representation of the voltage signal. For example, the driver stage (726 or 918) can generate the current ramp signal Io, which can be proportional to magnitude of the input voltage and inductance of the isolator circuit (706 or 908). At 1040, the current ramp signal is injected into the input of the isolator to reduce or suppress voltage droop in the input voltage signal when the input voltage signal is applied to the input of the isolator. For example, the generated output current ramp signal I0 can be injected into the isolator circuit (706 or 908) to suppress voltage droop.

Even though baseline wander correction, as described herein, is performed with regards to a primary side of an isolation circuit (e.g., a transformer), the disclosure is not limited in this regard. Since a transformer includes a primary and a secondary side that are coupled, correcting the voltage droop in the primary side will automatically correct the droop in the secondary side as well. Put another way, although the current compensation is physically performed in the primary side (as explained herein), baseline wander correction takes place in both the primary and the secondary sides of the isolation circuit.

Various Notes & Examples

Example 1 is a circuit for compensation of baseline voltage wander at an input of an isolator, the circuit comprising: a filter circuit, wherein the filter circuit is configured to receive an input voltage signal from an input of the isolator and configured to generate a filtered representation of the voltage signal; and a driver circuit configured to use information about a voltage magnitude extracted from the filtered representation of the voltage signal to generate an output current ramp signal, the driver circuit configured to inject the output current ramp signal into the input of the isolator to reduce or suppress voltage droop in the input voltage signal when the input voltage signal is applied to the input of the isolator.

In Example 2, the subject matter of Example 1 optionally includes a gain circuit configured to amplify the filtered representation of the voltage signal, and provide the amplified filtered representation of the voltage signal to the driver circuit for generating the output current ramp signal.

In Example 3, the subject matter of any one or more of Examples 1-2 optionally includes wherein the isolator comprises an inductive device.

In Example 4, the subject matter of Example 3 optionally includes wherein the inductive device has inductance of less than 80 microHenry.

In Example 5, the subject matter of any one or more of Examples 3-4 optionally includes wherein the driver circuit is configured to generate the output current ramp signal at least in part using information about the voltage magnitude extracted from the filtered representation of the voltage signal and a value of an inductance corresponding to the inductive device.

In Example 6, the subject matter of Example 5 optionally includes wherein the driver circuit is configured to generate the output current ramp signal having a slope generated using information about a value of the voltage magnitude extracted from the filtered representation of the voltage signal and the value of the inductance corresponding to the inductive device.

In Example 7, the subject matter of any one or more of Examples 1-6 optionally includes wherein the isolator comprises a transformer.

In Example 8, the subject matter of any one or more of Examples 1-7 optionally includes wherein the driver circuit is configured to establish a zero-average DC current for the output current ramp signal.

In Example 9, the subject matter of Example 8 optionally includes wherein the driver circuit and filter circuit are configured to reduce the voltage droop to maintain the input voltage signal within a specified range of a desired input voltage signal while maintaining a zero-average DC current for the output current signal.

In Example 10, the subject matter of any one or more of Examples 1-9 optionally includes wherein the driver circuit is configured to generate the output current ramp signal including a ramp duration corresponding to a transmit pulse duration, the transmit pulse included as a portion of the input voltage signal.

In Example 11, the subject matter of any one or more of Examples 1-10 optionally includes wherein the driver circuit is configured to generate the output current ramp signal including releasing the ramp signal in response to information about one or more of a transmit pulse duration or a current limit established to avoid saturation of the isolator.

In Example 12, the subject matter of any one or more of Examples 1-11 optionally include wherein the filter circuit and the current driver circuit are coupled in a closed-loop configuration, with an output of the current driver circuit coupled to an input of the filter circuit.

In Example 13, the subject matter of any one or more of Examples 1-12 optionally include wherein the filtering circuit comprises a transconductance amplifier coupled to a capacitor.

Example 14 is a compensation loop circuit for compensation of baseline voltage wander at an input of an isolator, the circuit comprising: a filter circuit coupled to an input of the isolator, the filter circuit configured to receive an input voltage signal from the input of the isolator and generate a filtered representation of the voltage signal; a gain circuit coupled to an output of the filter circuit, the gain circuit configured to amplify the filtered representation of the voltage signal to generate an amplified voltage signal; and a driver circuit coupled to an output of the gain circuit and an input of the filter circuit to form the compensation loop circuit, the driver circuit configured to generate an output current ramp signal based on the amplified voltage signal, wherein the driver circuit is further configured to inject the output current ramp signal into the input of the isolator to reduce or suppress voltage droop in the input voltage signal when the input voltage signal is applied to the input of the isolator, and wherein the output current ramp signal is configurable based on a voltage gain associated with the input voltage signal and an output voltage signal corresponding to the output current ramp signal.

In Example 15, the subject matter of Example 14 optionally includes wherein the filter circuit comprises an integrating capacitor, and wherein the voltage gain of the compensation loop circuit is configured based on adjusting capacitance of the integrating capacitor, to change the output current ramp signal.

Example 16 is a method for generating a signal to compensate baseline voltage wander, the method comprising: receiving an input voltage signal from an input of an isolator circuit; filtering the received input voltage signal to generate a filtered representation of the voltage signal; generating a current ramp signal proportional to inductance associated with the isolator circuit and a voltage magnitude extracted from the filtered representation of the voltage signal; and injecting the current ramp signal into the input of the isolator to reduce or suppress voltage droop in the input voltage signal when the input voltage signal is applied to the input of the isolator.

In Example 17, the subject matter of Example 16 optionally includes amplifying the filtered representation of the voltage signal to generate an amplified voltage signal; and converting the amplified voltage signal into a current signal to generate the current ramp signal, wherein the current ramp signal is configurable based on a voltage gain associated with the input voltage signal and an output voltage signal corresponding to the current ramp signal.

In Example 18, the subject matter of Example 17 optionally includes selecting a desired voltage gain based on one or both of the inductance or temperature of the isolation circuit.

In Example 19, the subject matter of Example 18 optionally includes adjusting the voltage gain based on the desired voltage gain, to modify the current ramp signal.

In Example 20, the subject matter of Example 19 optionally includes wherein adjusting the voltage gain further comprises: adjusting one or both of transconductance or capacitance of at least one circuit used to generate the currant ramp signal.

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A circuit for compensation of baseline voltage wander at an input of an isolator, the circuit comprising:
   a filter circuit, wherein the filter circuit is configured to receive an input voltage signal and generate a filtered representation of the input voltage signal; and
   a driver circuit configured to use information about a voltage magnitude extracted from the filtered representation of the input voltage signal to generate an output current ramp signal, and the driver circuit is further configured to inject the output current ramp signal into the input of the isolator to reduce or suppress voltage droop in the input voltage signal, wherein the input voltage signal and the output current ramp signal are both applied to the input of the isolator.

2. The circuit of claim 1, further comprising:
   a gain circuit configured to amplify the filtered representation of the input voltage signal, and provide the amplified filtered representation of the input voltage signal to the driver circuit for generating the output current ramp signal.

3. The circuit of claim 1, wherein the isolator comprises an inductive device.

4. The circuit of claim 3, wherein the inductive device has inductance of less than 80 microHenry.

5. The circuit of claim 3, wherein the driver circuit is configured to generate the output current ramp signal at least in part using information about the voltage magnitude extracted from the filtered representation of the input voltage signal and a value of an inductance corresponding to the inductive device.

6. The circuit of claim 5, wherein the driver circuit is configured to generate the output current ramp signal having a slope generated using information about a value of the voltage magnitude extracted from the filtered representation of the input voltage signal and the value of the inductance corresponding to the inductive device.

7. The circuit of claim 1, wherein the isolator comprises a transformer.

8. The circuit of claim 1, wherein the driver circuit is configured to establish a zero-average DC current for the output current ramp signal.

9. The circuit of claim 8, wherein the driver circuit and filter circuit are configured to reduce the voltage droop to maintain the input voltage signal within a specified range of a desired input voltage signal while maintaining a zero-average DC current for the output current signal.

10. The circuit of claim 1, wherein the driver circuit is configured to generate the output current ramp signal including a ramp duration corresponding to a transmit pulse duration, the transmit pulse included as a portion of the input voltage signal.

11. The circuit of claim 1, wherein the driver circuit is configured to generate the output current ramp signal including releasing the ramp signal in response to information about one or more of a transmit pulse duration or a current limit established to avoid saturation of the isolator.

12. The circuit according to claim 1, wherein the filter circuit and the driver circuit are coupled in a closed-loop configuration, with an output of the driver circuit coupled to an input of the filter circuit.

13. The circuit according to claim 1, wherein the filter circuit comprises a transconductance amplifier coupled to a capacitor.

14. A compensation loop circuit for compensation of baseline voltage wander at an input of an isolator, the circuit comprising:
    a filter circuit coupled to an input of the isolator, the filter circuit configured to receive an input voltage signal from the input of the isolator and generate a filtered representation of the voltage signal;
    a gain circuit coupled to an output of the filter circuit, the gain circuit configured to amplify the filtered representation of the voltage signal to generate an amplified voltage signal; and
    a driver circuit coupled to an output of the gain circuit and an input of the filter circuit to form the compensation loop circuit, the driver circuit configured to generate an output current ramp signal based on the amplified voltage signal,
    wherein the driver circuit is further configured to inject the output current ramp signal into the input of the isolator to reduce or suppress voltage droop in the input voltage signal, wherein the input voltage signal and the output current ramp signal are both applied to the input of the isolator, and
    wherein the output current ramp signal is configurable based on a voltage gain associated with the input voltage signal and an output voltage signal corresponding to the output current ramp signal.

15. The compensation loop circuit of claim 14, wherein the filter circuit comprises an integrating capacitor, and wherein the voltage gain of the compensation loop circuit is configured based on adjusting capacitance of the integrating capacitor, to change the output current ramp signal.

16. A method for generating a signal to compensate baseline voltage wander, the method comprising:
    receiving an input voltage signal from an input of an isolator circuit;
    filtering the received input voltage signal to generate a filtered representation of the input voltage signal;
    generating a current ramp signal proportional to inductance associated with the isolator circuit and a voltage magnitude extracted from the filtered representation of the input voltage signal; and
    injecting the current ramp signal into the input of the isolator to reduce or suppress voltage droop in the input voltage signal, wherein the input voltage signal and the current ramp signal are both applied to the input of the isolator.

17. The method according to claim 16, further comprising:
    amplifying the filtered representation of the voltage signal to generate an amplified voltage signal; and
    converting the amplified voltage signal into a current signal to generate the current ramp signal, wherein the current ramp signal is configurable based on a voltage gain associated with the input voltage signal and an output voltage signal corresponding to the current ramp signal.

18. The method according to claim 17, further comprising:
    selecting a desired voltage gain based on one or both of the inductance or temperature of the isolation circuit.

19. The method according to claim 18, further comprising:
    adjusting the voltage gain based on the desired voltage gain, to modify the current ramp signal.

20. The method according to claim 19, wherein adjusting the voltage gain further comprises:
    adjusting one or both of transconductance or capacitance of at least one circuit used to generate the current ramp signal.

* * * * *

UNITED STATES PATENT AND TRADEMARK OFFICE
CERTIFICATE OF CORRECTION

PATENT NO. : 9,906,211 B2  
APPLICATION NO. : 15/226564  
DATED : February 27, 2018  
INVENTOR(S) : Miguel Ángel Fernández Robayna Page 1 of 1

It is certified that error appears in the above-identified patent and that said Letters Patent is hereby corrected as shown below:

On the Title Page

On page 2, in Column 1, under "Other Publications", Line 2, delete "Prrinted" and insert --Printed-- therefor Signed and Sealed this
Twenty-eighth Day of May, 2019

Andrei Iancu
*Director of the United States Patent and Trademark Office*